United States Patent [19]

Stock et al.

[11] Patent Number: 4,524,240

[45] Date of Patent: Jun. 18, 1985

[54] UNIVERSAL CIRCUIT PROTOTYPING BOARD

[75] Inventors: Rodney D. Stock, San Rafael; Gary H. Newman, Novato, both of Calif.

[73] Assignee: Lucasfilm Ltd., San Rafael, Calif.

[21] Appl. No.: 523,766

[22] Filed: Aug. 17, 1983

[51] Int. Cl.³ .............................................. H05K 1/02
[52] U.S. Cl. .................................. 174/68.5; 361/406; 361/409
[58] Field of Search ................. 361/409, 406; 174/68.5

[56] References Cited

U.S. PATENT DOCUMENTS

| | | | |
|---|---|---|---|
| 3,325,766 | 6/1967 | Kolb et al. ........................ | 361/406 X |
| 3,546,539 | 12/1970 | Wilcox, Jr. et al. ............ | 174/68.5 X |
| 3,567,999 | 3/1971 | Larson et al. ................... | 174/68.5 X |
| 3,891,898 | 6/1975 | Damon ............................. | 361/406 |
| 3,917,984 | 11/1975 | Kong et al. ..................... | 174/68.5 X |
| 4,031,371 | 6/1977 | Devries ........................... | 174/68.5 X |
| 4,330,684 | 5/1982 | Hayward ......................... | 174/68.5 |

OTHER PUBLICATIONS

Vero Electronics, D.I.P. Boards, Sockets and Terminal Pins pamphlet of Jul. 1972, pp. 1 to 4.
Circuit-Stik, Inc., Circuit-Stik catalog #501, 1970, pp. 1 & 2, Gardenia, California.

Primary Examiner—R. R. Kucia
Attorney, Agent, or Firm—Majestic, Gallagher, Parsons & Siebert

[57] ABSTRACT

A universal multilayer circuit prototyping board is provided having a predefined universal pattern of socket pin perforations which accommodates all standard DIP integrated circuit packages at virtually any position on the board. The universal board allows high density circuit packing while maintaining excellent electrical performance with high speed circuits.

9 Claims, 4 Drawing Figures

UNIVERSAL CIRCUIT PROTOTYPING BOARD

BACKGROUND OF THE INVENTION

This invention relates to printed circuit boards and particularly to a circuit board for constructing prototypes of systems consisting mainly of an interconnection of integrated circuit (IC) packages.

The primary form of integrated circuit packages in use today includes two parallel rows of conductive pins extending downward from opposite long sides of a rectangularly shaped package, commonly referred to as a dual-in-line package (DIP). The pins are positioned a standard one-tenth inch (0.1 in.) apart along the rows and the two rows of pins are spaced apart an integral multiple of 0.1 inch depending upon the size of the package. The more commonly used integrated circuits have packages with their rows of pins spaced apart 0.2, 0.3, 0.4, 0.6 or 0.9 inch. The length of such packages depends upon the number of pins that are provided and this varies widely. In the course of building and testing a newly designed electronic system, it is desireable to be able to easily assemble and electrically interconnect a large number of such packages of various sizes in a prototype system.

In the development of systems which include integrated circuits, various types of prototyping boards are used. These boards range from perforated breadboards without conductors, to selectively perforated and multilayer plated boards, and to custom laid out boards. In order to accommodate DIP packages, a prototype board contains a pattern of perforations that accept the circuit package pins for mechanical and electrical interconnection. Prototyping circuit boards should satisfy certain requirements, primary among which is versatility. The wider the variety of circuit packages that can be accommodated, the more useful the board is. It is also highly desireable to provide a significant proportion of the circuit board area without perforations and with electrically conductive layers thereon for proper power distribution to the circuit packages. Further, high density positioning of the various size circuit packages is desirable for good electrical performance, as are an efficient pattern of interconnections and high quality conductors. Mechanical characteristics are also important. Unfortunately, these criteria often interfere with each other and must be compromised.

Heretofore, various multilayer prototyping boards have been known in the art, including the Model 347 prototyping board manufactured by MUPAC Corporation of Brockton, Mass. Another manufacturer is the Augat Corporation of Attleboro, Mass. These prototyping boards are generally adapted to wire-wrap type tools and interconnections. Connectors may be provided thereon for power supply and signal inputs and outputs. Substantial areas of the board are generally dedicated to these special functions, which limits layout flexibility. The ability to accommodate various sized DIP's has been achieved in the past through either dedicating areas of the board to different DIP sizes, which imposes adverse constraints on the size and location of different sized DIP's, or by providing a very low density universal pattern.

Because of these constraints, it has not been the practice to lay out a prototype board as it is to be configured in production. Since board production techniques may not have the above described constraints, This drawback has been a particular problem in the design of high speed logic systems, where signal path lengths are crucial and preferably as short as possible. A prototype circuit with incorrect signal path lengths may not be a complete indicator of how the circuit will perform in a production version. Therefore, there is a need for a prototyping board which matches the flexibility and high performance commonly available with production technology.

It is therefore an object of this invention to provide a universal circuit prototyping board that will handle all standard dual-in-line package (DIP) integrated circuit packages.

It is also an object to provide a prototyping board having a generally uniform pattern of socket, component and wiring holes suitable for an efficient pattern of interconnections while optimizing packing density.

It is another object to provide a multilayer prototyping board having holes suitable for any type IC pin socket and for wiring posts, and allowing any type of wiring between sockets, posts, and connectors.

It is yet another object to provide a prototyping board with such flexibility without sacrificing conductive areas on the board that are desirable for efficient power distribution to the integrated circuits mounted on it.

It is an additional object to provide a prototyping board which facilitates the same layout for a prototype circuit as would be used in production.

It is a further object to provide a prototyping board which meets all of the above criteria simultaneously and inexpensively.

SUMMARY OF THE INVENTION

According to the invention, a multilayer planar circuit board is provided for use in constructing circuitry comprising integrated circuit packages and related components. The board has layers of conductive and dielectric patterns perforated by a predefined uniform hole pattern selected to accommodate any standard DIP circuit in virtually any location. The hole pattern provides great flexibility in the layout of integrated circuits, permitting high density circuit packing without requiring segregation among packages by size. Lead holes are provided for receiving capacitors on either side of the board. This permits power supply bypass without sacrificing layout freedom or circuit packing density. A central portion of the circuit board layout pattern may be adapted to receive external connectors.

This universal circuit board is compatible with a variety of common prototyping wiring geometries and methods such as the wirestitch, wire-wrap and quick-connect techniques.

Other advantages of the invention will be apparent upon reference to the following detailed description taken in conjunction with the accompanying drawings.

DETAILED DESCRIPTION OF THE PREFERRED EMBODIMENT

Figure 1:
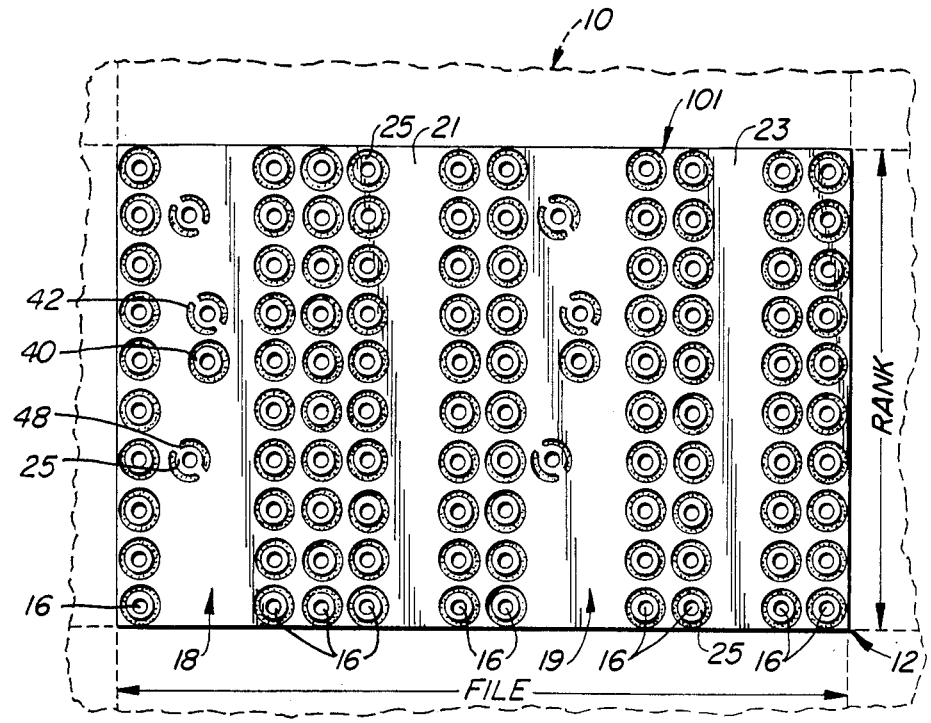
FIG. 1 is a plan view of the component side of a preferred embodiment of a prototyping board according to the invention, showing its pattern of socket pin holes.
Figure 2:
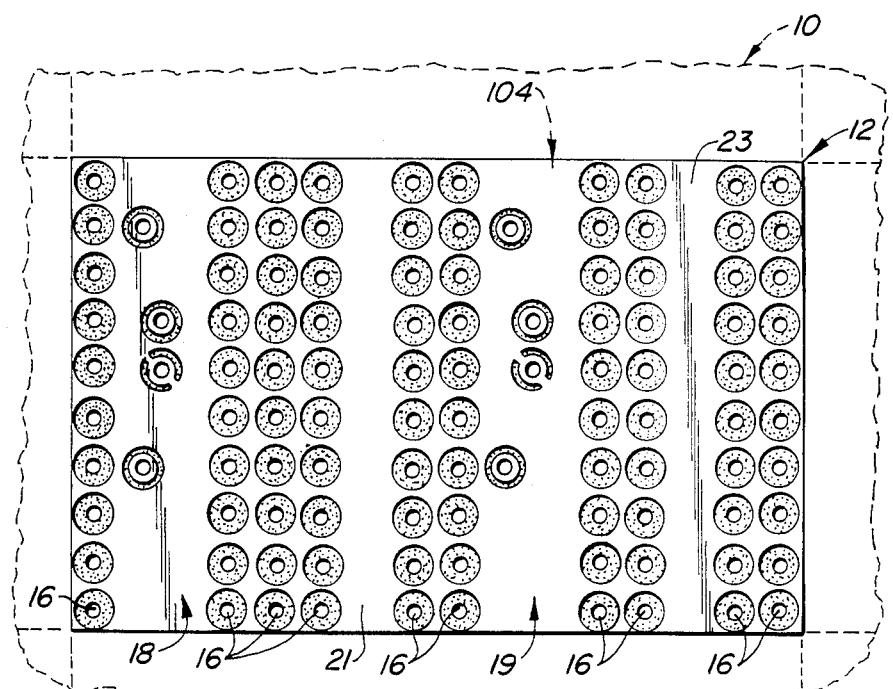
FIG. 2 is a plan view of the wiring side of a board as it would be seen if viewed through the board, showing a its pattern as in FIG. 1.

Referring to FIGS. 1 and 2, there is shown a component side (FIG. 1) and a circuit side (FIG. 2) of a preferred embodiment of a prototyping board 10 according to the invention. The exterior physical dimensions of the board 10 have been selected to be generally the same as those of other boards, such as the MUPAC board. It is to be understood, however, that various multiples of the standard pattern of holes disclosed herein could be used, as appropriate, to produce boards having other exterior dimensions.

A standard pattern 12, according to the present invention, is repeated in contiguous ranks and files over the layout area. In the preferred embodiment there are fourteen ranks and nine files. Each rank is one inch across and each file is 1.6 inches across. Ranks and files contain respectively ten rows and sixteen columns, each being 0.1 inch wide. Ten of the columns have non-plated-through socket pin holes 16 in every row. Two double columns 18 and 19 without socket holes 16 are provided at a minimum spacing of seven columns (center to center). Single columns 21 and 23 without socket holes 16 are provided at a minimum spacing of seven columns (center to center) and separated by at least two columns from double columns 18 and 19. The component side (FIG. 1) is distinguishable from the circuit side (FIG. 2) by the presence on the component side of conductive pads 25 around each socket hole 16 and ground capacitor lead hole 40 which are insulated from the surrounding conductive sheet 101. However, for manufacturing ease, the conductive pads 25 may be omitted. This pattern of socket pin holes allows excellent utilization of the layout area for any of the standard DIP integrated circuits.

Figure 3:
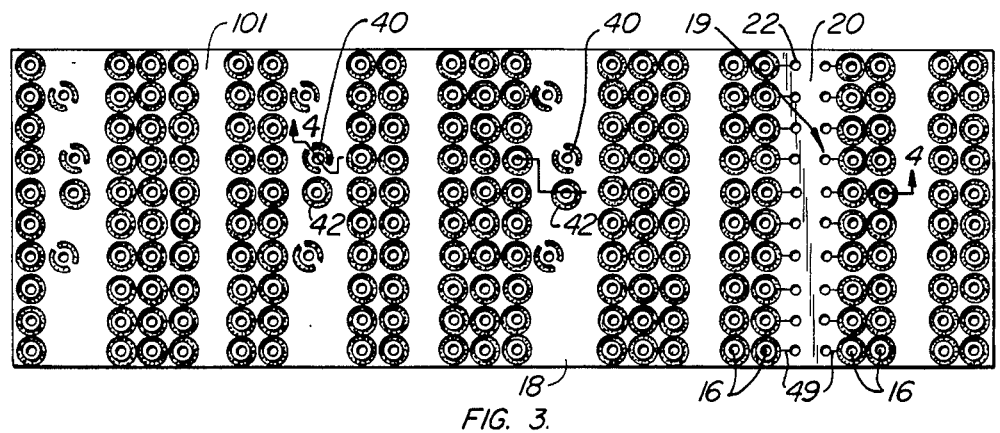
FIG. 3 is a plan view of a pattern of socket pin holes according to the present invention which includes input-output (I/O) connector post holes on the component side of the board.

Inasmuch as the standard layout area of board 10 is capable of accommodating circuitry in excess of conventional board I/O capacity, provision is typically made for accepting standard I/O and power connectors in an interior part of the board. One or more I/O signal connector areas 20 may be disposed in the double columns 18 and 19, as shown in FIG. 3, without interfering with the useability of neighboring socket pin holes 16. I/O connectors 20 may be of various lengths but typically have 30 connector pin holes 22 in each of the pairs 18 of adjacent columns.

There may also be provided areas for I/O connectors outside the layout area, such as for conventional backplane connectors, not shown. In the preferred embodiment, backplane connectors provide all power and ground sources for the board, as well as signal I/O. Additional conventional I/O connectors having any of a large variety of shapes, or a universal strip may be provided at the handle end of the board (not shown).

Figure 4:
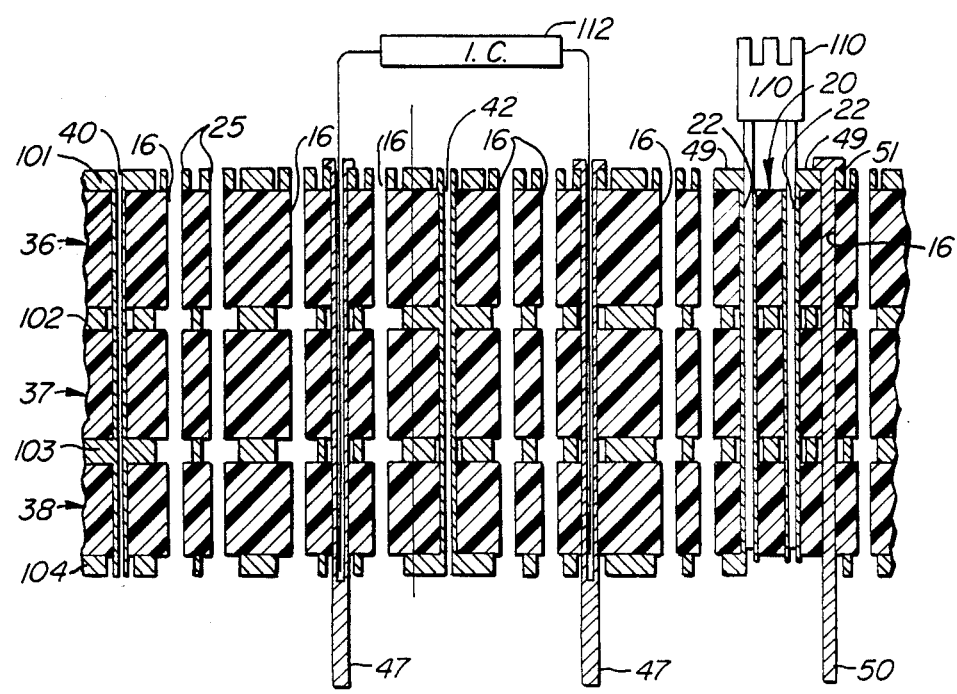
FIG. 4 is a cross-sectional view taken along line 4—4 of FIG. 3, showing an I/O connector area and a mounted integrated circuit.

As shown in cross-section in FIG. 4 (depth exaggerated), the prototyping board comprises three layers of dielectric circuit board material 36, 37, and 38, which may be fiberglass epoxy compound, sandwiched together between alternating sheets 101, 102, 103, 104, of electrically conductive material such as metal. The top (component side) sheet 101 and intermediate sheet 103 are each patterned to conduct the supply voltage from voltage supply pins in the backplane connectors. Intermediate sheet 102 and the bottom sheet 104 are each similarly patterned to conduct the ground voltage from ground supply pins in the backplane connectors.

Prototype board 10 may be constructed by first sandwiching the three dielectric layers 36, 37, and 38, with intermediate conductive sheets 102 and 103, together. Connector pin holes 22 for all of the desired connectors are then drilled through the sandwiched layers. Connector pin holes 22 are centered 1/10 inch apart and are 0.037 inches in diameter. Sets of capacitor lead holes 40 and 42 are also drilled at one inch intervals in those parts of double columns 18 and 19 which do not have connector pin holes 22. Sets of capacitor lead holes 40 and 42 may also be drilled outside the layout area. Sheets 101 and 104 are then plated onto the outside of board 10. Capacitor lead holes 40 contact both sheets 101 and 103, which are to be tied to power. Capacitor led holes 42 contact both sheets 102 and 104 which are to be tied to ground. Connector pin holes 22 and capacitor lead holes 40 and 42 are plated through. Printed circuit traces 49 are provided on the component side (FIG. 3) to (not yet formed) adjacent socket holes 16. Those connector pin holes 22 that are intended for ground and power supply voltages may make contact with the conductive layers by way of wiring posts 50 inserted in respective socket holes 16.

Socket pin holes 16 are drilled, in the standard pattern 12, after external plating and thus are not plated. Holes 16 are centered in the rows and the columns, 1/10 of an inch apart, and are 0.057 inches in diameter. The diameter of plated holes after plating and unplated holes is nominally the same.

The sets of capacitor lead holes 40 and 42 in the layout area are provided for mounting bypass capacitors (not shown) on either side of board 10. Placement of these capacitors allows a circuit designer adequate freedom to bypass the power supply while avoiding the usual sacrifice of layout area and component packing density. The bypass capacitors are sufficiently small not to interfere with prototype wiring. Larger decoupling capacitors may be inserted in capacitor lead holes outside of the layout area, also on the wiring side of the board. The internal dielectric layers 36, 37, 38 and particularly layer 37 surrounded by intermediate conductive layers 102 and 103 also serve as a distributed capacitor.

Gold or tin plated socket pins 47 (FIG. 4) may be inserted in socket pin holes 16. Gold or tin plated wiring posts 50 may be inserted in the socket pin holes 16 adjacent connector pin holes 22. Printed circuit traces 47 connect the plated connector pin holes 22 to pads 51 of the socket holes 16 serving the wiring posts 50. A standard connector 110 may be mounted directly in holes 22. An integrated circuit 112 may be mounted in the socket pins 47. Socket pins 47 may be of any standard type, and any standard wiring technique may be used, including "Wire-wrap," "Wire-stitch," or "Quick-connect."

If I/O connector areas 20 are not used, the printed circuit traces 49 linking them to the adjacent socket pin holes 16 have no effect, and leave those holes 16 free for use in placing IC packages.

While the above is a full and complete description of the preferred embodiment of the present invention, various modifications, alternate configurations and equivalents may be employed without departing from the true spirit and scope of the present invention. For example, the board may be formed with only two conductive layers, and various modes of construction are contemplated.

Therefore, the above description and illustrations should not be taken as limiting the scope of the present invention which is defined by the appended claims.

It is claimed:

1. A prototyping board, comprising:

at least one dielectric layer intermediate of first and second electrically conductive layers forming a sandwich having a top side for component insertion and a bottom side for circuit wiring;

said sandwich having, coextensive in each layer, a layout area in which a pattern of socket pin holes on a standard 0.1 inch center is repeated in contiguous substantially 1.0 inch wide ranks and 1.6 inch wide files;

each one of said patterns having 10 equal sized rows in said ranks and 16 equal sized columns in said files, wherein ten of said columns in each one of said patterns defines socket pin holes in every row, and wherein two pairs of adjacent columns in each one of said patterns excludes socket pin holes, said pairs of said adjacent columns being separated by six columns, and wherein said rows comprise a pattern of repeated columns of said socket pin holes ("hole") and excluded socket pin holes ("space") as follows: hole, space, space, hole, hole, hole, space, hole, hole, space, space, hole, hole, space, hole, hole, thereby to accommodate dual-in-line package (DIP) circuits of various standard widths at various locations relative to said pattern.

2. The prototyping board of claim 1 having, in selected rows of said adjacent pairs of columns which exclude pin holes, at least one voltage wiring post hole, at least one voltage lead hole, and at least one ground lead hole, said voltage led hole and said ground lead hole for accommodating a bypass capacitor.

3. The prototyping board of claim 1 wherein said layout area defines at least one I/O connector area, said connector area comprising serial pairs of connector pin holes in selected adjacent columns which exclude socket pin holes.

4. The prototyping board of claim 3 including, outside said layout area, at least one I/O connector area comprising two parallel lines of connector pin holes and, adjacent to said lines of connector pin holes, two parallel lines of wiring post holes corresponding to said lines of connector pin holes.

5. The prototyping board of claim 3 including, outside said layout area, at least one connector area for I/O signals, power, and ground comprising three lines of connector pin holes and, adjacent thereto, three corresponding lines of wiring post holes.

6. The prototyping board of claim 5 wherein each said connector pin hole is conductively plated and is connected by a printed circuit trace only to the adjacent socket pin hole.

7. The prototyping board of claim 4 wherein, counting from the top, said conductive patterns on the first and third conductive layers contact voltage wiring post holes, said conductive patterns on the second and fourth conductive layers contact said ground lead holes, and said ground lead holes are conductively plated.

8. The prototyping board of claim 3 wherein each said socket pin hole in each said standard pattern is adapted to receive an insertable plated socket pin; and wherein each said voltage wiring post hole is adapted to receive an insertable plated wiring post.

9. The prototyping board of claim 1 wherein said standard pattern of holes is repeated in at least 14 ranks and at least 9 files.

* * * * *

UNITED STATES PATENT AND TRADEMARK OFFICE
CERTIFICATE OF CORRECTION

PATENT NO. : 4,524,240
DATED : June 18, 1985
INVENTOR(S) : Stock et al.

It is certified that error appears in the above-identified patent and that said Letters Patent is hereby corrected as shown below:

Column 6, line 19: "5" should be --3--.

Signed and Sealed this

Twenty-fourth Day of September 1985

[SEAL]

Attest:

DONALD J. QUIGG

Attesting Officer

Commissioner of Patents and
Trademarks—Designate